(12) United States Patent
Yasuda

(10) Patent No.: US 6,383,914 B1
(45) Date of Patent: May 7, 2002

(54) METHOD OF MANUFACTURING AN ALUMINUM INTERCONNECT STRUCTURE OF A SEMICONDUCTOR DEVICE HAVING <111> ORIENTATION

(75) Inventor: Makoto Yasuda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/466,811

(22) Filed: Dec. 20, 1999

(30) Foreign Application Priority Data

Dec. 21, 1998 (JP) .......................................... 10-362468

(51) Int. Cl.$^7$ .......................................... H01L 21/4763
(52) U.S. Cl. ....................... 438/625; 438/626; 438/627; 438/629; 438/631; 438/633; 438/643; 438/645; 438/648; 438/653; 438/656; 438/672; 438/685; 438/687; 438/688
(58) Field of Search ................................ 438/625, 626, 438/627, 629, 631, 633, 643, 645, 648, 653, 656, 672, 685, 687, 688

(56) References Cited

U.S. PATENT DOCUMENTS

| 5,242,860 A | * | 9/1993 | Nulman et al. ............. 438/688 |
| 5,312,772 A | * | 5/1994 | Yokoyama et al. ......... 438/688 |
| 5,449,641 A | * | 9/1995 | Maeda ....................... 438/688 |
| 6,207,568 B1 | * | 3/2001 | Liu et al. .................... 438/688 |

FOREIGN PATENT DOCUMENTS

| JP | 9-17785 | 1/1997 |
| JP | 9-275139 | 10/1997 |
| JP | 9-306989 | 11/1997 |
| JP | 10-173043 | 6/1998 |
| JP | 10-294314 | 11/1998 |
| JP | 11-354519 | 12/1999 |
| JP | 2000-114263 | 4/2000 |

* cited by examiner

Primary Examiner—John F. Niebling
Assistant Examiner—Lynne Gurley
(74) Attorney, Agent, or Firm—Young & Thompson

(57) ABSTRACT

A method for manufacturing an interconnect structure of a semiconductor device includes forming a bottom interconnect layer underlying a dielectric layer and overlying a silicon substrate; forming a through-hole in the dielectric layer to expose the bottom interconnect later; depositing a first barrier metal layer overlying the dielectric layer and on an inner wall of the through-hole; depositing a metal layer on the first barrier metal layer for filling the through-hole; etching the metal layer and the first barrier metal layer until the dielectric film is exposed to thereby form a via plug of the metal layer and the barrier metal layer; depositing a second barrier metal layer on the dielectric film and the via plug; and depositing an interconnect layer of which a main component is aluminum on the second barrier metal layer.

18 Claims, 7 Drawing Sheets

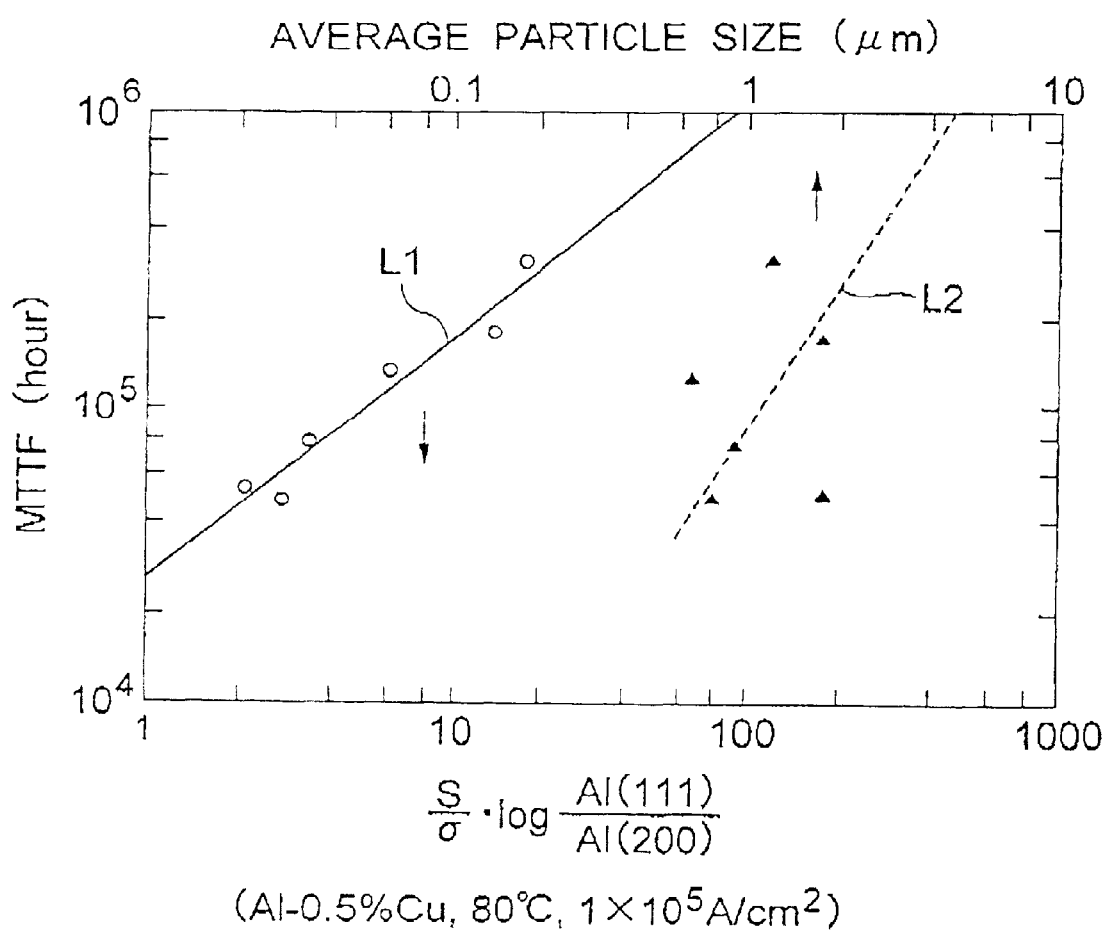

METHOD OF MANUFACTURING AN ALUMINUM INTERCONNECT STRUCTURE OF A SEMICONDUCTOR DEVICE HAVING <111> ORIENTATION

BACKGROUND OF THE INVENTION (a) Field of the Invention

The present invention relates to an interconnect structure of a semiconductor device and a method for manufacturing the same, specifically, a multiple-layered interconnect structure having aluminum as a main component which can suppress occurrence and growth of electro-migration (EM) and a method of manufacturing the same.

(b) Description of the Related Art

With the advance of high integration of semiconductor devices, the multi-layered interconnect structure in which a plurality of interconnect layers are connected to one another is more and more complicated.

An example of a method for manufacturing a conventional multi-layered interconnect structure will be described referring to FIGS. 1A to 1F.

A bottom interconnect layer 14 is deposited on an undercoat dielectric film 12 overlying a silicon substrate (not shown), and an interlayer dielectric film 16 made of a plasma oxide is formed and flattened on the bottom interconnect layer 14 as shown in FIG. 1A.

The bottom interconnect layer 14 includes, for example, an Al-Cu alloy film 14a constituting a main a interconnect body, a Ti layer 14b formed thereon and having a thickness of 25 nm, and a first TiN layer 14c having a thickness of 50 nm formed as a reflection preventing film in a photolithographic process. The Ti layer is formed for preventing formation of AlN during deposition of a first TiN layer As shown in FIG. 1B, a through-hole 18 is formed in the interlayer dielectric film 16 to reach to the bottom interconnect layer 14 by a lithographic and etching process.

Then, as shown in FIG. 1C, a second TiN layer 20 20 is formed as a barrier metal layer on the entire surface of the wafer including the walls of the connection aperture 18 followed by formation of a tungsten (W) layer 22 on the second TiN layer 20.

Then, as shown in FIG. 1D, the tungsten layer 22 is etched-back by employing a plasma etching method until the second TiN layer 20 is exposed, thereby forming a plug 24 of tungsten.

Then, as shown in FIG. 1E, a third TiN layer 26 having a thickness of 40 nm is deposited as a barrier metal layer on the second TiN layer 20, followed by deposition of an Al—Cu alloy layer 28 on the third TiN layer 26 by sputtering at a temperature of 340° C. After the Al—Cu alloy layer 28 is cooled for 50 seconds, a Ti layer 30 having a thickness of 25 nm and a TiN layer 32 having a thickness of 50 nm are sequentially deposited on the Al—Cu alloy layer 28 by sputtering to form a top interconnect layer 34.

The TiN layer 26 prevents excessive increase of a contact resistance between the Al—Cu alloy layer 28 and the tungsten layer 22 even if a void is formed in the Al—Cu alloy layer 28 on the plug 24 due to the EM.

Patterning of the TiN layer 32, the Ti Layer 30, the Al—Cu alloy layer 28, the third TiN layer 26 and the second TiN layer 20 by a lithographic and dry-etching treating provides top interconnects 34 having a desired interconnect pattern as shown in FIG. 1F.

In the above conventional interconnect structure, with the miniaturization thereof, the lifetime of the interconnect is considerably reduced due to the EM of the Al—Cu alloy layer to increase the interconnect resistance during the operation, and finally an interconnect deficiency such as a break down may be generated.

Since current is likely to be concentrated to the interconnect right above the plug, migration of the aluminum due to the EM may easily occur to make a void.

SUMMARY OF THE INVENTION

In view of the foregoing, an object of the present invention is to provide an interconnect structure which can suppress occurrence and growth of the EM of the aluminum and a method for manufacturing the same.

The present invention provides, in a first aspect thereof, an interconnect structure of a semiconductor device including: a silicon substrate; a bottom interconnect layer formed in a dielectric layer overlying the silicon substrate; a top interconnect layer having aluminum as a main component and connected with the bottom interconnect layer by way of a via plug formed in the dielectric layer; and a <111> oriented first barrier metal layer disposed between the via plug and the top interconnect layer.

The present invention provides, in a second aspect thereof, a method for manufacturing an interconnect structure of a semiconductor device, including the steps of: forming a bottom interconnect layer underlying a dielectric layer and overlying a silicon substrate; forming a throughhole in the dielectric layer to expose the bottom interconnect layer; depositing a first barrier metal layer overlying the dielectric layer and on an inner wall of the through-hole; depositing a metal layer on the first barrier metal layer for filling the through-hole; etching the metal layer and the first barrier metal layer until the dielectric film is exposed to thereby form a via plug of the metal layer and the barrier metal layer; depositing a second barrier metal layer on the dielectric film and the via plug; and depositing an interconnect layer of which a main component is aluminum on the second barrier metal layer.

In accordance with the interconnect structure of the present invention and fabrication from the method of the present invention, the increased <111> orientation of the aluminum of the top interconnects suppresses the occurrence and the growth of the EM of the aluminum. Accordingly, substantially no interconnect deficiencies due to the EM are generated to provide a reliable interconnect structure.

The above and other objects, features and advantages of the present invention will be more apparent from the following description.

BRIEF DESCRIPTION OF DRAWINGS

FIG. 2 is a graph showing the relationship between mean time to failure and <111> orientation of aluminum and between the average mean time to failure and an average particle size of aluminum particles.

PREFERRED EMBODIMENTS OF THE INVENTION

As a result of investigating reasons of the growth of the EM of aluminum in a conventional interconnect structure, the present inventor has found that the EM grows because <111> orientation of the aluminum in an Al—Cu alloy layer with respect to a silicon substrate having the interconnect structure is extremely low.

A mean time to failure (MTTF) is closely related with the <111> orientation of the aluminum as shown in a line (L1) in a graph of FIG. 2 in which the MTTF is plotted on ordinate and a function of the <111> orientation of the aluminum $\{(S/\sigma) \log[Al(111)/Al(200)]\}$ on abscissa. As shown therein, the MTTF increases with the increase of <111> orientation of the aluminum. The relation of the above graph was obtained by employing an alloy interconnect of Al—0.5% Cu at a temperature of 80° C. and a current density of $1\times10^5$ A/cm².

The trouble of the multi-layered interconnect structure having the Al—Cu alloy is mainly caused by the growth of the EM of the aluminum which is delayed with the increase of the particle size of the aluminum crystal. Thus, it is estimated that the growth of the EM the aluminum can be effectively suppressed with the increase of the <111> orientation of the aluminum which increases a particle size of the aluminum crystal.

As shown by a line (L2) in the graph of FIG. 2, the MTTF increases with the increase of the particle size of the aluminum crystal.

Figure 1A:
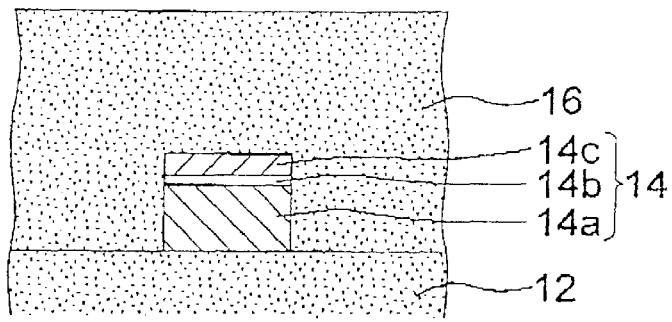
FIGS. 1A to 1F are vertical sectional views sequentially showing a series of steps of manufacturing a conventional semiconductor device.
Figure 1B:
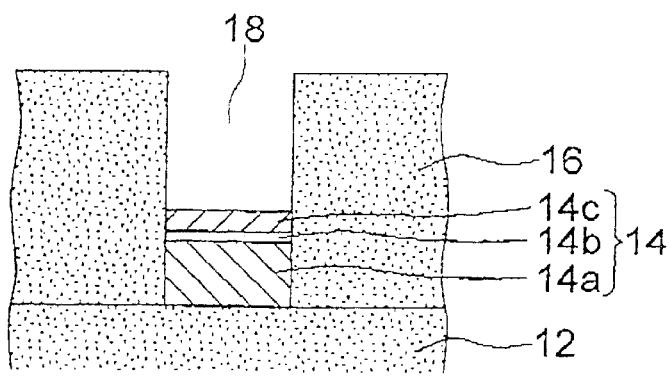
Figure 1C:
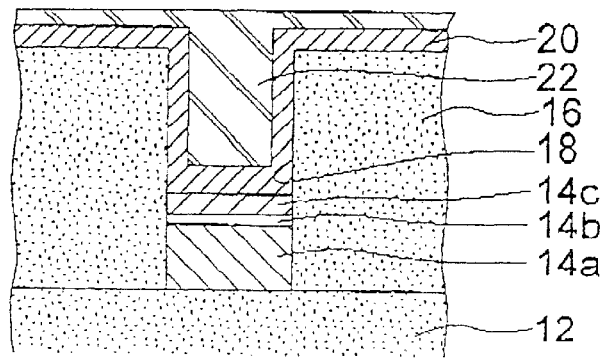
Figure 1D:
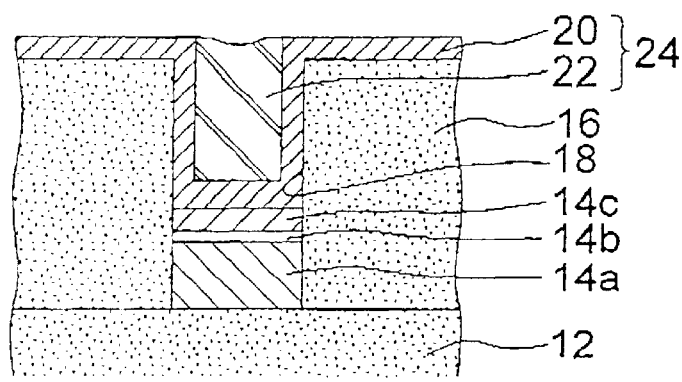
Figure 1E:
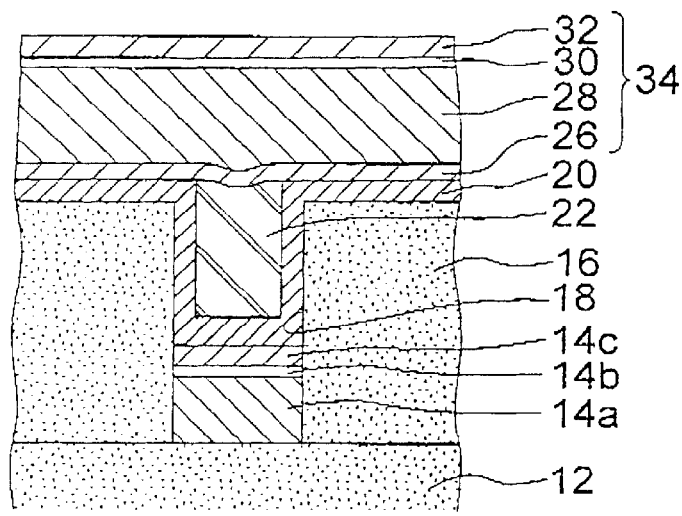
Figure 1F:
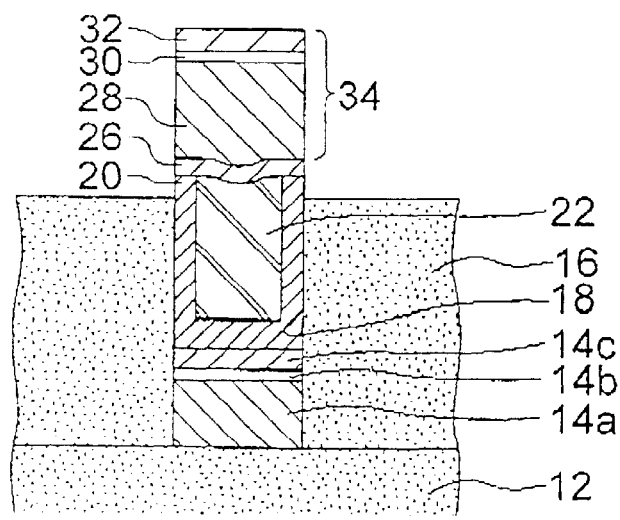
Figure 3A:
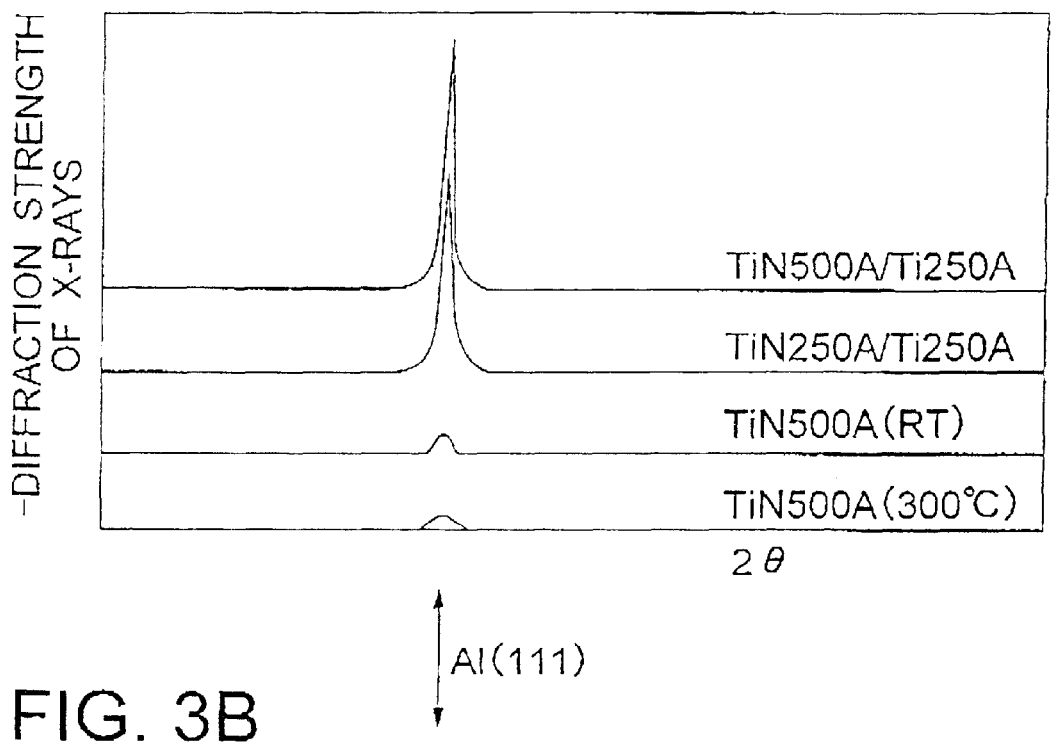
FIG. 3 shows graphs regarding a relation between a composition of a barrier metal layer and the <111> orientation of the aluminum.
Figure 3B:
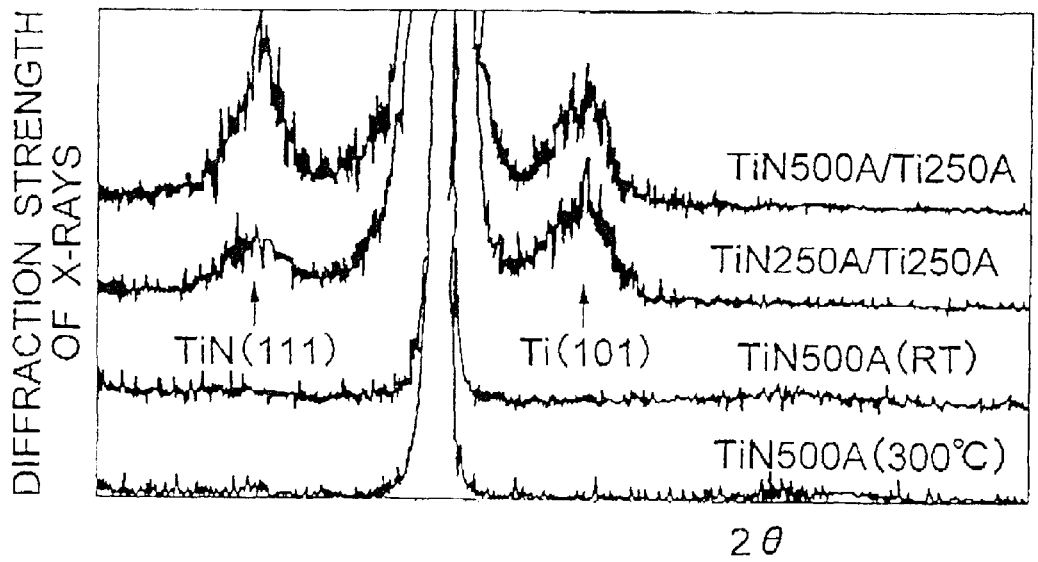

The present inventor has further found that a relation such as shown in graphs of FIGS. 3A and 3B holds between the composition of the barrier metal layer positioned between the Al—Cu interconnect and the via plug and the <111> orientation of the aluminum in the Al—Cu interconnect. In the graphs, FIGS. 3A and 3B show XRD analysis results which are obtained by plotting 2θ on abscissa and diffraction strength of X-rays on ordinate. A certain plane direction of a certain material can be determined from the value of 2θ at which the diffraction strength of X-rays has a peak, and a degree of the orientation of the plane direction can be determined from the peak value of the diffraction strength of X-rays.

It can be seen from FIGS. 3A and 3B that when the barrier metal layer includes only the TiN layer, the <111> orientation of the TiN layer and the aluminum is low and that when the barrier metal layer includes the Ti layer and the TiN layer, the <111> orientation of the TiN layer and the aluminum is largely elevated.

In the present invention, the number of the layers of the interconnect structure is not restricted as far as the top interconnects are made of a metal or an alloy of which a main component is aluminum. For example, in case of a three-layered interconnect structure, a second level interconnect layer is selected as a bottom interconnect layer and a third is level interconnect layer is selected as a top interconnect layer.

The first barrier metal layer in the present invention is preferably a stacked film including a TiN layer and a TiN layer formed thereon. The via plug preferably includes a second barrier metal layer and a tungsten layer. The top interconnect layer is preferably made of an Al—Cu alloy.

Thicknesses of the Ti layer and the TiN layer included in the lower portion of the first barrier metal layer are 20 nm or more and 25 nm or more, respectively. The thicknesses of the above layers below the specified values reduce the effect of suppressing the occurrence and the growth of the EM of the aluminum.

The top layers of the dielectric film is preferably made of plasma oxide which has an excellent CMP- polished ability and an effect of preventing contamination of the substrate with a metal.

Now, the present invention is more specifically described with reference to accompanying drawings.

Embodiment with Respect to Interconnect Structure

Figure 4:
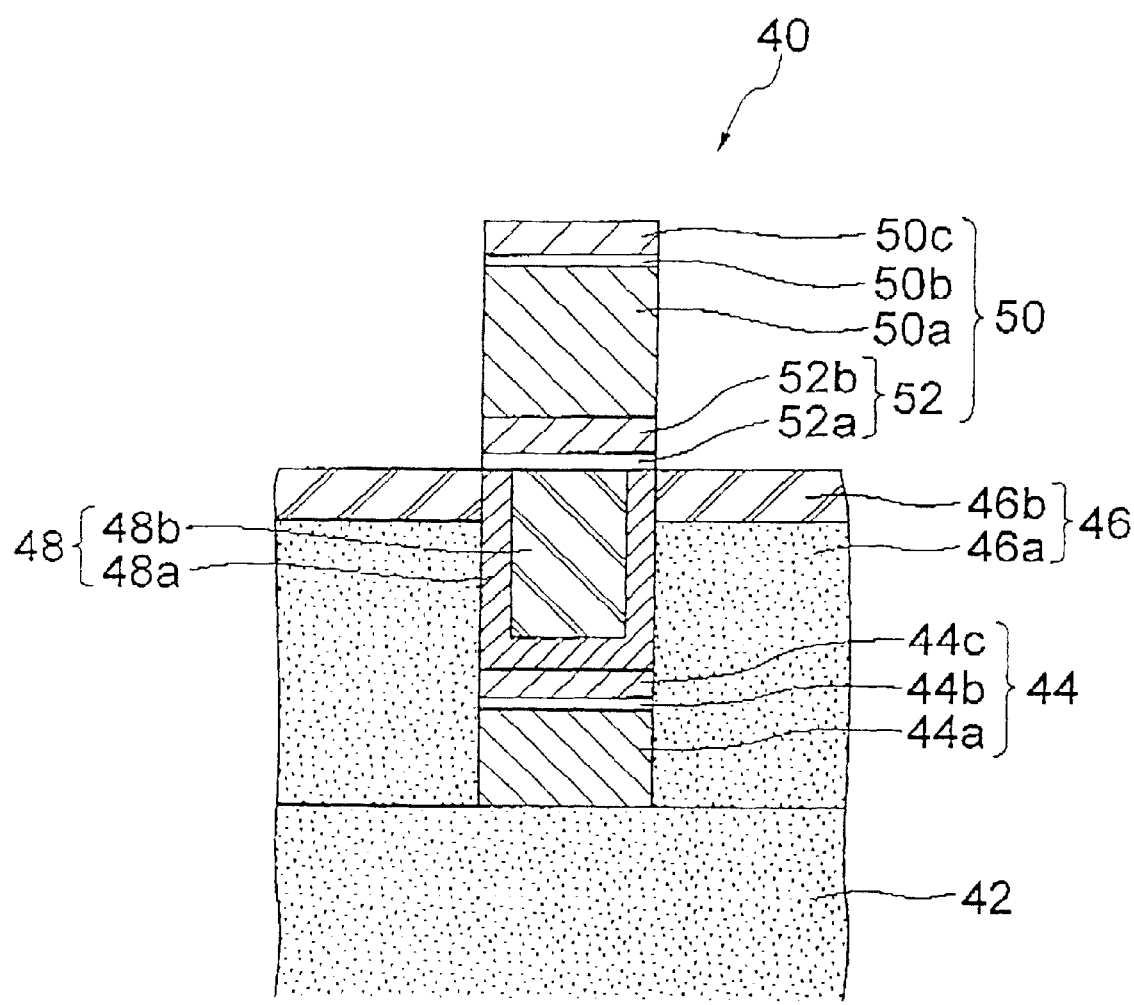
FIG. 4 is a vertical sectional view showing a semiconductor device having a stacked structure in accordance with a first embodiment of the present invention.

An interconnect structure 40 overlying a semiconductor substrate (not shown) of a semiconductor device in accordance with a first embodiment shown in FIG. 4 includes an undercoat dielectric film 42, bottom interconnects 44 formed thereon, an interlayer dielectric film 46 formed around the bottom interconnects 44, a via plug 48 penetrating the interlayer dielectric film 46 and top interconnects 50 connected to the bottom interconnects 44 by way of the via plug 48.

The bottom interconnects 44 and the top interconnects 50 are patterned in accordance with respective specified patterns.

The bottom interconnects 44 include a first Al—Cu alloy layer 44a constituting an interconnect body, a first Ti layer 44b having a thickness of 25 nm for preventing formation of AlN during deposition of a first TiN layer, and the first TiN layer 44c having a thickness of 50 nm formed as a reflection preventing film in a photolithographic treatment for patterning an interconnect layer.

The interlayer dielectric film 46 includes a bottom layer BPSG film 46a and CVD oxide, for example, a SiOF film 46b formed on the BPSG film 46a by a plasma CVD method.

The SiOF film 46b has an excellent CMP polished ability for forming the via plug 48 and traps, by gettering, a metal, for example, phosphorous (P) in a polishing agent employed in the CMP polishing to effectively prevent contamination of the substrate with the metal.

The via plug 48 is formed by filling a connection aperture, with a via plug forming material, partially penetrating the interlayer dielectric film 46 to expose the bottom interconnects 44, and includes a second TiN layer 48a formed as a barrier metal layer on the wall of the connection aperture including the bottom surface, and a tungsten layer 48b formed by filling the connection aperture.

The top interconnects 50 include a first stacked barrier metal layer 52 having a second Ti layer 52a of a thickness of 20 nm and a third TiN layer 52b on the second Ti layer 52a deposited on the via plug 48, a second Al—Cu alloy layer (top interconnect layer) 50a constituting a main interconnect of the top interconnects 50, a third Ti layer 50b for preventing formation of AlN during deposition of a fourth TiN layer on the second Al—Cu alloy layer 50a and the fourth TiN layer 50c formed as a reflection preventing film in a photolithographic treatment for patterning an interconnect layer.

The second Al—Cu alloy layer 50a consists of, for example, 0.5% in weight of copper and a balance of aluminum.

Thicknesses of the second Al—Cu alloy layer 50a, the third Ti layer 50b and the fourth TiN layer 50c are 450 nm, 25 nm and 50 nm, respectively.

Since the first stacked barrier metal layer 52 of the top interconnects 50 in the interconnect structure 40 of the first embodiment includes the second Ti layer 52a and the third TiN layer 52b having higher <111> orientation, the <111> orientation of the aluminum in the second Al—Cu alloy layer 50a of the top interconnects 50 is extremely high to noticeably suppress the occurrence and the growth of the EM of the aluminum. Substantially no interconnect deficiency due to the EM provides the interconnect structure having high reliability.

After an interconnect sample was manufactured having a similar structure to the interconnect structure 40 of the first embodiment shown in FIG. 4, a life test of the sample was conducted. It was observed that an average trouble occurring period was prolonged to about 2.5 times compared with that of the conventional interconnect structure shown in FIGS. 1A to 1F.

Embodiment with Respect to Manufacture of Interconnect Structure

An example of manufacturing the interconnect structure of the first embodiment shown in FIG. 4 will be described, as a second embodiment, referring to FIGS. 5A to 5F sequentially showing the respective steps of the manufacture.

Figure 5A:
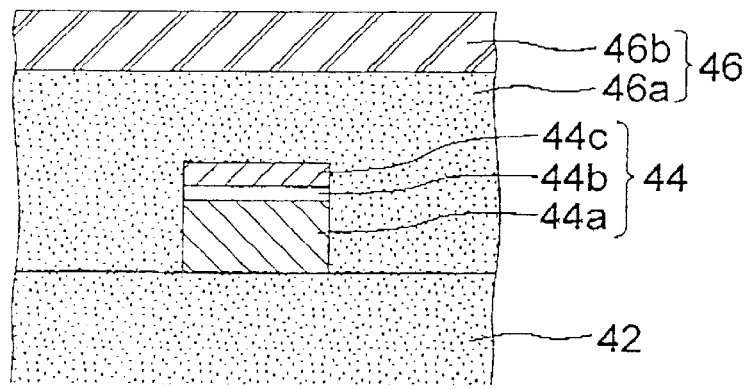
FIGS. 5A to 5F are vertical sectional views sequentially showing a series of manufacturing steps in accordance with a second embodiment of the present invention.

At first, the bottom interconnects 44 are formed on the undercoat dielectric film 42 overlying the silicon substrate (not shown) as shown in FIG. 5A.

As the bottom interconnects 44, the first Al—Cu alloy layer 44a constituting the main interconnect, the first Ti layer 44b having a thickness of 25 nm and the first TiN layer 44c having a thickness of 50 nm are sequentially deposited by sputtering.

The BPSG film 46a and the SiOF film 46b are sequentially formed on the bottom interconnects 44 to provide the interlayer dielectric film 46. The SiOF film 46b is formed by a plasma CVD method and thereafter flattened. The SiOF film 46b has an excellent CMP polished ability for forming the via plug 48 and traps a metal to effectively prevent contamination of the substrate with the metal.

Figure 5B:
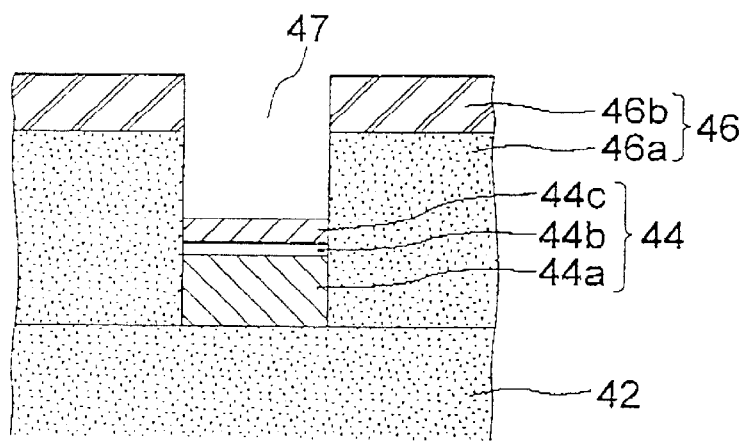

As shown in FIG. 5B, the connection aperture 47 is formed partially penetrating the interlayer dielectric film 46 including the SiOF film 46b and the BPSG film 46a to reach to the bottom interconnects 44 by means of a lithographic etching treatment.

Figure 5C:
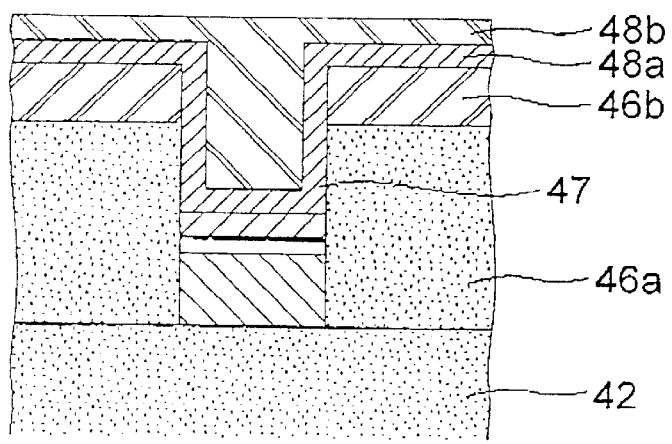

Then, as shown in FIG. 5C, the second TiN layer 48a as a second barrier metal layer is formed on the entire surface of the substrate including the wall of the connection aperture 47, and the tungsten layer 48b is formed on the second TiN layer 48a.

Figure 5D:
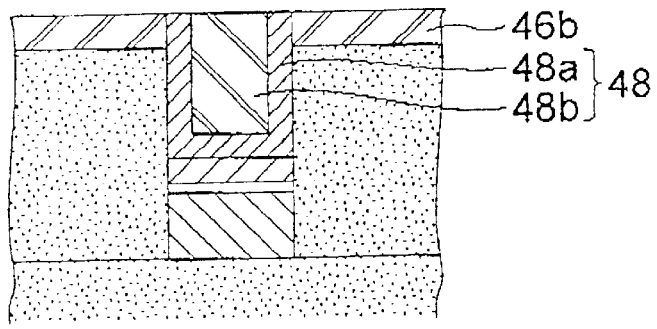
Figure 5E:
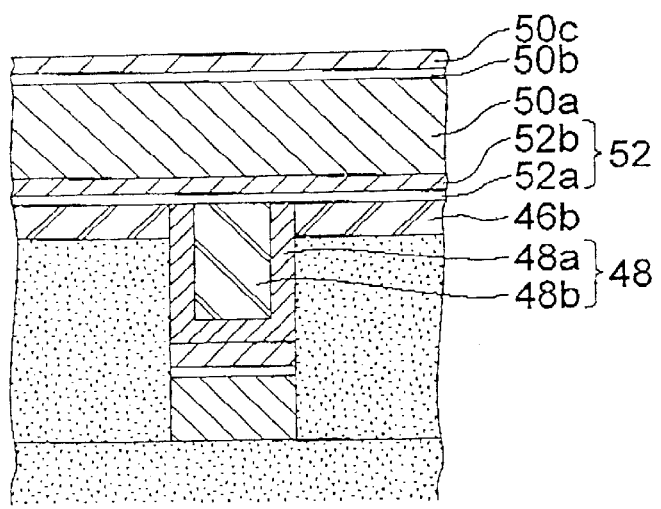

Thereafter, the tungsten layer 48b and the second TiN layer 48a are removed by CMP polishing until the SiOF film 46b is exposed for forming the via plug 48 as shown in FIG. 5D.

The barrier metal layer, when formed on the SiOF film 46b flattened by the CMP polishing having a high degree of flatness, has higher <111> orientation.

Then, as shown in FIG. 6E, the stacked barrier metal layer 52 including the second Ti layer 52a having a thickness of 20 nm and the third TiN layer 52b having a thickness of 40 nm is deposited, as the barrier metal layer, on the via plug 48 and the SiOF film 46b by sputtering.

The second Ti layer 52a is deposited by sputtering without back-heating while an argon gas is flown at 35 sccm, and after the formation of the second Ti layer 52a, the third TiN layer 52b is continuously deposited by sputtering without back-heating while an argon gas and a nitrogen gas are flown at 57 sccm and 85 sccm, respectively. The "continues deposition" in the present invention means that the latter deposition is conducted in the same sputtering apparatus as that employed in the former deposition or the latter deposition is conducted without any other treatment after the wafer is conveyed from the sputtering apparatus to another in a non-oxidative ambient.

After the formation of the third TiN layer 52b, the second Al—Cu alloy layer 50a having a thickness of 450 nm constituting the main interconnect of the top interconnects 50 is continuously deposited on the third TiN layer 52b while an argon gas is flown at 35 sccm by sputtering at a temperature of 340° C. The second Al—Cu alloy layer 50a consists of, for example, 0.5% in weight of copper and a balance of aluminum.

After the deposition of the second Al—Cu alloy layer 50a, cooling is conducted by leaving the wafer in a cooling chamber for about 60 seconds until the temperature in the chamber is lowered to 200° C.

On the second Al—Cu alloy layer 50a, another stacked barrier metal layer including the third Ti layer 50b having a thickness of 25 nm for preventing formation of AlN during the deposition of the fourth TiN layer 50c and the fourth TiN layer 50c having a thickness of 50 nm formed as a reflection preventing film in a photolithographic treatment for patterning an interconnect layer is deposited by sputtering.

The third Ti layer 50b can be formed without back-heating while an argon gas is flown at 35 sccm, and the fourth TiN layer 50c can be deposited by sputtering without back-heating while an argon gas and a nitrogen gas are flown at 57 sccm and 85 sccm, respectively.

Figure 5F:
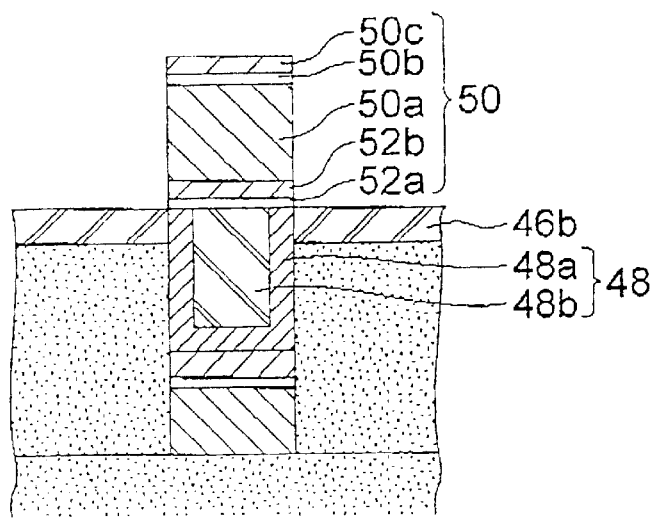

Then, the fourth TiN layer 50c, the third Ti layer 50b, the second Al—Cu alloy layer 50a, the third TiN layer 52b and the second Ti layer 52a are patterned by a lithographic dry etching treatment to form the top interconnects 50 having a desired interconnect pattern as shown in FIG. 5F.

Since the above embodiments are described only for examples, the present invention is not limited to the above embodiments and various modifications or alternations can be easily made therefrom by those skilled in the art without departing from the scope of the present invention.

What is claimed is:

1. A method for manufacturing an interconnect structure of a semiconductor device, comprising the steps of:
    forming a bottom interconnect layer underlying a dielectric layer and overlying a silicon substrate;
    forming a dielectric layer having as an upper surface a SiOF film formed by a plasma CVD method;
    forming a through-hole in the dielectric layer having the plasma SiOF film as the upper surface to expose the bottom interconnect layer;
    depositing a first barrier metal layer overlying the dielectric layer and on an inner wall of the through-hole;
    depositing a metal layer on the first barrier metal layer for filling the through-hole;
    removing the metal layer and the first barrier metal layer by using a CMP method until the plasma SiOF film of the upper dielectric layer is exposed to thereby form a via plug of the metal layer and the first barrier metal layer;
    depositing a second barrier metal layer on the plasma SiOF film of the upper dielectric layer and the via plug; and
    depositing a top interconnect layer of which a main component is aluminum on the second barrier metal layer, the top interconnect layer (50a) being <111> oriented and overlying a higher oriented said second barrier metal layer.

2. The method as defined in claim 1, wherein the second barrier metal layer is formed by sequentially depositing a Ti layer and a TiN layer by sputtering.

3. The method as defined in claim 2, wherein the TiN layer is continuously deposited by sputtering after the deposition of the Ti layer.

4. The method as defined in claim 3, wherein the top interconnect layer is made of an Al—Cu alloy.

5. The method as defined in claim 3, wherein the top interconnect layer is continuously deposited by sputtering after the deposition of the TiN layer.

6. The method as defined in claim 5, wherein the top interconnect layer is continuously deposited by sputtering after the deposition of the TiN layer.

7. The method as defined in claim 5, comprising a further step of forming a Ti layer and a TiN layer on the top interconnect layer which are deposited after the top interconnect layer is cooled for a specified period of time upon the completion of the top interconnect layer depositing step.

8. The method as defined in claim 5, wherein the top interconnect layer is made of an Al—Cu alloy.

9. The method as defined in claim 2 further comprising a step of forming a Ti layer and a TiN layer on the top interconnect layer which are deposited after the top interconnect layer is cooled for a specified period of time upon the completion of the top interconnect layer depositing step.

10. The method as defined in claim 9, comprising a further step of forming a Ti layer and a TiN layer on the top interconnect layer which are deposited after the top interconnect layer is cooled for a specified period of time upon the completion of the top interconnect layer depositing step.

11. The method as defined in claim 9, wherein the top interconnect layer is made of an Al—Cu alloy.

12. The method as defined in claim 2, wherein the top interconnect layer is made of an Al—Cu alloy.

13. The method as defined in claim 1, wherein the top interconnect layer is made of an Al—Cu alloy.

14. The method as defined in claim 1, wherein the metal layer (48b) is formed by depositing tungsten (W).

15. The method as defined in claim 14, wherein the second barrier metal layer is formed by sequentially depositing a Ti layer and a TiN layer by sputtering.

16. The method of claim 1, wherein the dielectric layer is formed to have as a bottom layer a BPSG film.

17. A method for manufacturing an interconnect structure of a semiconductor device, comprising the steps of:

forming a bottom interconnect layer underlying a dielectric layer and overlying a silicon substrate;

forming a through-hole in the dielectric layer to expose the bottom interconnect layer;

depositing a first barrier metal layer overlying the dielectric layer and on an inner wall of the through-hole;

depositing a metal layer on the first barrier metal layer for filling the through-hole;

removing the metal layer and the first barrier metal layer until the dielectric layer is exposed to thereby form a via plug of the metal layer and the first barrier metal layer;

depositing a second barrier metal layer on the dielectric layer and the via plug; and depositing a top interconnect layer of which a main component is aluminum on the second barrier metal layer; wherein CMP polishing is employed for removing the metal layer and the first barrier metal layer in the via plug forming step; and wherein the top interconnect layer is <111> oriented.

18. A method for manufacturing an interconnect structure of a semiconductor device, comprising the steps of:

forming a bottom interconnect layer underlying a dielectric layer and overlying a silicon substrate;

forming a dielectric layer having as a bottom layer a BPSG film, and having as an upper surface a SiOF film formed by a plasma CVD method;

forming a through-hole in the dielectric layer having the plasma SiOF film as the upper surface to expose the bottom interconnect layer;

depositing a first barrier metal layer overlying the dielectric layer and on an inner wall of the through-hole;

depositing a metal layer on the first barrier metal layer for filling the through-hole;

removing the metal layer and the first barrier metal layer by using a CMP method until the plasma SiOF film of the upper dielectric layer is exposed to thereby form a via plug of the metal layer and the first barrier metal layer;

depositing a second barrier metal layer on the plasma SiOF film of the upper dielectric layer and the via plug, the second barrier metal layer comprising a substance having a <111> orientation; and depositing a top interconnect layer of which a main component is aluminum on the second barrier metal layer, the top interconnect layer (50a) being <111> oriented and overlying a higher oriented said second barrier metal layer.

* * * * *